United States Patent
Komura et al.

(10) Patent No.: US 6,615,069 B1
(45) Date of Patent: Sep. 2, 2003

(54) MAGNETIC RESONANCE IMAGING DEVICE

(75) Inventors: Kazumi Komura, Matsudo (JP); Tetsuhiko Takahashi, Soka (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 09/719,805

(22) PCT Filed: Jun. 14, 1999

(86) PCT No.: PCT/JP99/03149
§ 371 (c)(1), (2), (4) Date: Dec. 18, 2000

(87) PCT Pub. No.: WO99/65391
PCT Pub. Date: Dec. 23, 1999

(30) Foreign Application Priority Data

Jun. 16, 1998 (JP) .......................................... 10-168015

(51) Int. Cl.⁷ ................................................ A61B 5/05
(52) U.S. Cl. ...................................... 600/412; 324/315
(58) Field of Search ................................. 600/412, 549, 600/410; 324/315, 309, 322

(56) References Cited

U.S. PATENT DOCUMENTS 5,378,987 A * 1/1995 Ishihara et al. ............. 324/315
5,711,300 A * 1/1998 Schneider et al. .......... 600/412
6,377,834 B1 * 4/2002 Zhou et al. .................. 600/412
6,445,183 B1 * 9/2002 Shimizu et al. ............. 324/309

FOREIGN PATENT DOCUMENTS

JP 61-8040 * 1/1986
JP 06098875 A * 4/1994

* cited by examiner

Primary Examiner—Quang T. Van
(74) Attorney, Agent, or Firm—Antonelli, Terry, Stout & Kraus, LLP

(57) ABSTRACT

An MRI apparatus and method in which image data is produced using NMR signals obtained in plural measurements performed at different times respectively. Data is calculated indicating temperature distribution within the object for image data of each measurement time and spatial discontinuity of the calculated temperature distribution data is corrected. Temperature change distribution within the object between different measurement times is calculated by subtracting the corrected temperature distribution data of each measurement time, and the calculated temperature change distribution is transformed to indicative data for supply to a display for display.

21 Claims, 8 Drawing Sheets

MAGNETIC RESONANCE IMAGING DEVICE

BACKGROUND OF THE INVENTION

The present invention relates to a magnetic resonance imaging apparatus (abbreviated as "MRI" hereinafter). In particular, it relates to an MRI apparatus for performing measurements of temperature distributions in vivo tissue.

In recent years, IVMR (Interventional MR) utilizing an MRI apparatus as a monitor has attracted attention. One of applications of IVMR is monitoring of temperature distributions in vivo tissue during laser therapy using an MRI apparatus. The techniques of imaging temperature distributions using MRI apparatuses include a method of finding temperature distributions from a signal intensity or a diffusion coefficient utilizing the fact that the signal intensity or diffusion coefficient varies with temperature change, a method of finding temperature distributions from the proton phase shift (PPS method: Proton Phase Shift method) and the like. Among these techniques, the PPS method is best in accuracy of measurement.

The PPS method utilizes the fact that when echo signals from water proton are measured, the proton phase is a function of temperature, as shown by the following equation (2). The procedure thereof is shown in FIG. 8.

$$T[°C.] = \frac{\phi [degree]}{TE[s] \times f[Hs] \times 0.01[ppm/°C.] \times 10^{-6} \times 360 [degree]} \quad (2)$$

In the equation, $\phi$ (degree) represents phase, TE [s] is time between excitation of spins and generation of echo signal, f [Hz] is proton resonance frequency, and 0.01 [ppm/°C.] is the temperature coefficient of water. The same notation is used hereinafter.

An imaging sequence using, for example, the gradient echo method shown in FIG. 1 is performed first, and echo signals required for MR image reconstruction are measured (800, 810).

By performing a Fourier transformation on these echo signals, a complex image S (x, y, z) is obtained, and a phase distribution $\phi$ (x, y, z) is obtained from the arctangent of a real part and an imaginary part (801,811) of the complex image according to the equation (1).

$$\phi(x,y,z) = \tan^{-1}\{Si(x,y,z)\} \quad (1)$$

In the equation, $\phi$ represents phase, Si is an imaginary part of a complex signal, and Sr is a real part of the complex signal. Each parameter is a function of space (x, y, z).

A temperature distribution can be found by applying the above-mentioned equation (2) to the thus obtained phase (802,812). Further, by performing subtraction of temperature distributions calculated respectively from signals obtained at different times t1 and t2, distribution of the temperature change of an examined object at a certain time can be obtained (820).

In the difference of the above-mentioned temperature distributions, difference at the background (part other than the examined object) is ideally zero since signal value of the background is zero. Actually, however, the influence of background noise cannot be eliminated from the difference. It may therefore be difficult to observe temperature change in a small area. Especially if the temperature change is to be displayed with gradation, the dynamic range becomes wider and the temperature change of a small area may be buried within the background noise.

Moreover, since the phase information is obtained by performing arctangent operation as shown in the equation (1) in the PPS method, it is theoretically possible that arctangent aliasing may be produced. When inhomogeneity of a static magnetic field is large, phase rotation increases and it becomes difficult to obtain accurate temperature distributions due to this aliasing. Furthermore, the part where the aliasing has been produced is emphasized upon performing subtraction of the above-mentioned temperature distributions, and false temperature changes, which have not actually occurred, may be observed.

An object of the present invention is to solve these problems and to provide an MRI apparatus capable of measuring temperature change distributions in an examined body precisely and which enables easy observation of the temperature change distributions.

SUMMARY OF THE INVENTION

To attain the above-mentioned objects, an MRI apparatus of the present invention comprises means for imparting a static magnetic field to an object to be examined, means for applying a plurality of gradient magnetic fields to the object, means for applying radio-frequency pulses for generating nuclear magnetic resonance in atomic nuclei of atoms constituting the object, detecting means for measuring nuclear magnetic resonance (NMR) signals from the object as complex signals, operating means for performing operations on the complex signals, and display means for displaying a result of the operations, wherein the operating means comprises means for extracting an object part from image data obtained from the complex signals, means for calculating a spatial phase distribution for the extracted part, means for calculating a temperature distribution based on the spatial phase distribution, means for calculating a temperature change distribution from the difference between data obtained in different measurements, and means for depicting the temperature change distribution.

By extracting only the object part from the image data prior to performing subtraction of data obtained in different measurements, the influence of background noise can be removed completely and information on the part with little temperature change can be reliably imaged. Means for calculating a temperature change distribution may calculate the temperature change distribution by first finding spatial phase distributions and temperature distributions from the image data obtained in two measurements respectively and performing subtraction thereof. Alternatively, it may perform subtraction of image data obtained in two measurements and then determine spatial phase difference distribution and temperature change distribution.

According to the preferred embodiment of an MRI apparatus of the present invention, means for calculating a spatial phase distribution calculates the above-mentioned spatial phase distribution according to the following equation (1), $$\phi(x,y,z) = \tan^{-1}\{Si(x,y,z)/Sr(x,y,z)\} \quad (1)$$

(In the equation, $\phi$ represents phase, Si is an imaginary part of a complex signal, and Sr is a real part of the complex signal. Each parameter is a function of space (x, y, z).) and includes means for correcting arctangent aliasing produced in the spatial phase distribution.

By correcting the arctangent aliasing when spatial phase distribution is measured, error caused by the arctangent calculation of signals can be reliably eliminated.

BEST MODE FOR CARRYING OUT OF THE INVENTION

An MRI apparatus of the present invention is hereafter explained in detail with reference to drawings.

Figure 2:
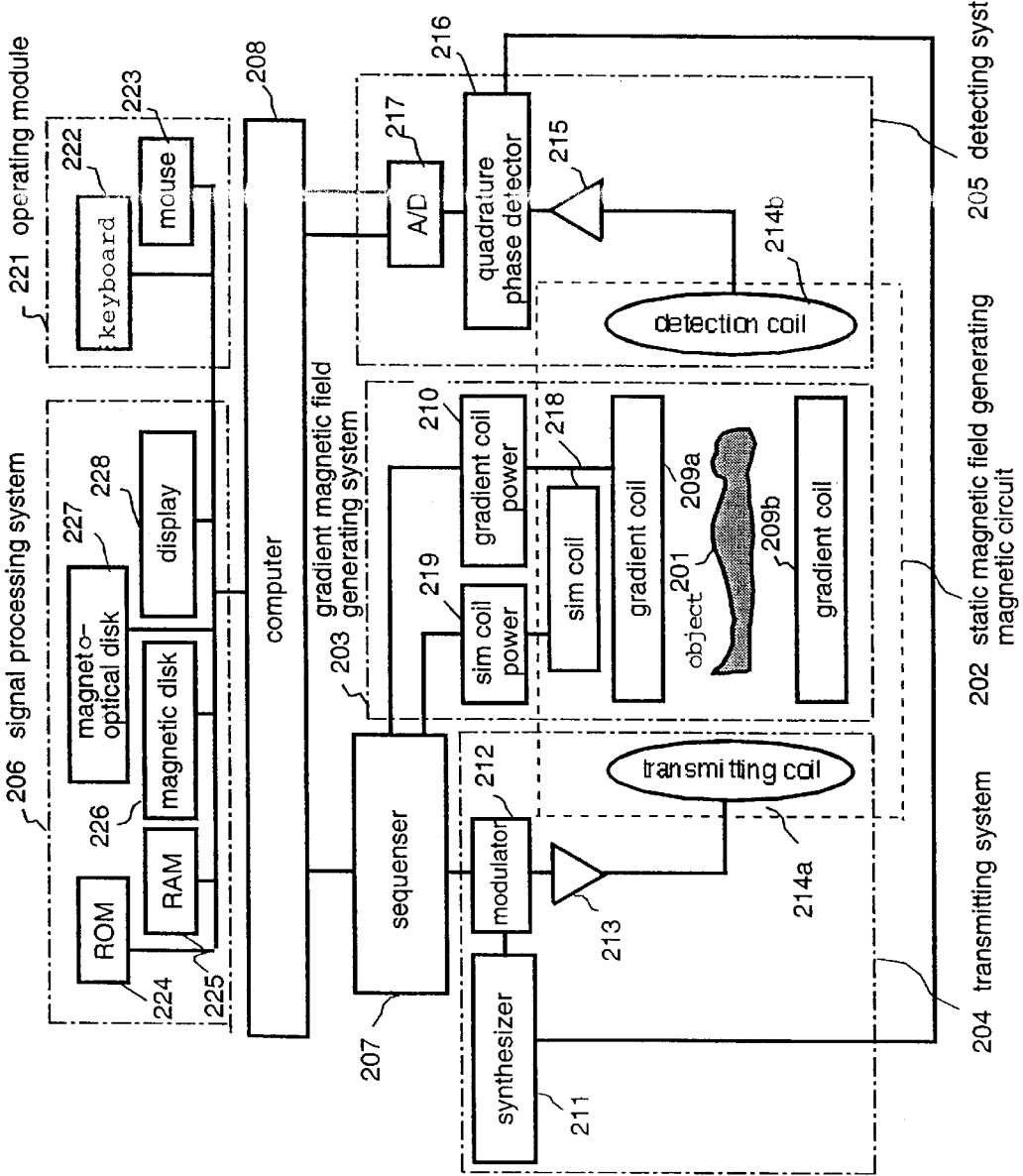
FIG. 2 is an overall block diagram representing an MRI apparatus which employs the present invention, wherein 201 is an object to be examined, 202 is a magnetic circuit for generating a static magnetic field, 203 is a gradient magnetic field generating system, 204 is a transmitting system, 205 is a detecting system, 206 is a signal processing system, 208 is a computer (operating means), and 228 is a display (displaying means).

FIG. 2 is a overall block diagram of an MRI apparatus to which the present invention is applied. The MRI apparatus consists mainly of a magnetic circuit 202 for generating a static magnetic field, a gradient magnetic field generating system 203, a transmitting system 204, a detecting system 205, a signal processing system 206, a sequencer 207, and a computer 208. The static magnetic field generating magnetic circuit 202, which consists of a superconductive electromagnet, ordinary electromagnet or a permanent magnet, generates a uniform static magnetic field H0 inside an object to be examined 201. A shim coil 218 having multiple channels for correcting inhomogeneity of the static magnetic field is disposed in a magnetic bore. The shim coil 218 is connected to a power source 219.

The gradient magnetic field generating system 203 consists of gradient magnetic field coils 209 for generating gradient magnetic fields Gx, Gy, and Gz whose intensities vary linearly in three orthogonal directions x, y and z, and power sources 210. The system 203 imparts positional information to the nuclear magnetic resonance (NMR) signals generated from the object 201.

The transmitting system 204 is equipped with a transmitting coil 214a which generates a radio frequency magnetic field. In order to generate the radio frequency magnetic field inside the object to excite nuclear spins, radio frequency waves produced by a synthesizer 211 are modulated by a modulator 212, amplified by a power amplifier 213, and applied to the coil 214a. The subjective atomic nucleus is ordinarily 1H but-it may be another atomic nucleus having nuclear spins such as 31P, 13C, etc.

The detecting system 205 is equipped with a detection coil 214b for detecting NMR signals emitted from the object 201. The NMR signals received by the coil 214b are passed through an amplifier 215, subjected to quadrature phase detection by a wave detector 216 to generate two-series data, and input into a computer 208 through an A/D converter 217.

The gradient magnetic field coil 209, transmitting coil 214a, and detection coil 214b are disposed in the magnetic bore. The transmitting coil 214a and detection coil 214b may be separately provided as shown in the figure, or a single coil for transmitting and receiving may be employed.

The signal processing system 206 comprises a computer 208, memories such as ROM 224, RAM 225, magnetic disk 226, and magneto-optical disk 227 for storing data during calculation and storing final data, i.e., the calculation results, and a CRT display 228 for displaying results of operations conducted by the computer 208. In addition, it is equipped with an operating module 221 including a keyboard 222 and mouse 223, for example, for input to the computer 208.

The sequencer 207 operates the gradient magnetic field generating system 203, the transmitting system 204, and the detecting system 205 according to a predetermined pulse sequence based on instructions from the computer 208.

In addition to sending instructions to the sequencer 207, the computer 208 performs operations such as a Fourier transformation on the two-series data from the detecting system 205, reconstruction of images corresponding to a density distribution of nuclear spins, a relaxation-time distribution, a spectrum distribution, etc., and calculation for temperature measurement. Specifically, for temperature measurement, it performs 1) extraction of an object part from image data, 2) calculation of spatial phase distributions for the extracted data, 3) subtraction between different spatial phase distributions, 4) temperature change calculation from the spatial phase distribution, 5) imaging of the temperature change, etc.

The display 228 displays MR images reconstructed by the computer 208 and the temperature change image as separate images or a synthesized image.

Next, the procedure for performing temperature measurement in the thus constructed MRI apparatus will be explained with the reference to FIG. 3.

Figure 1:
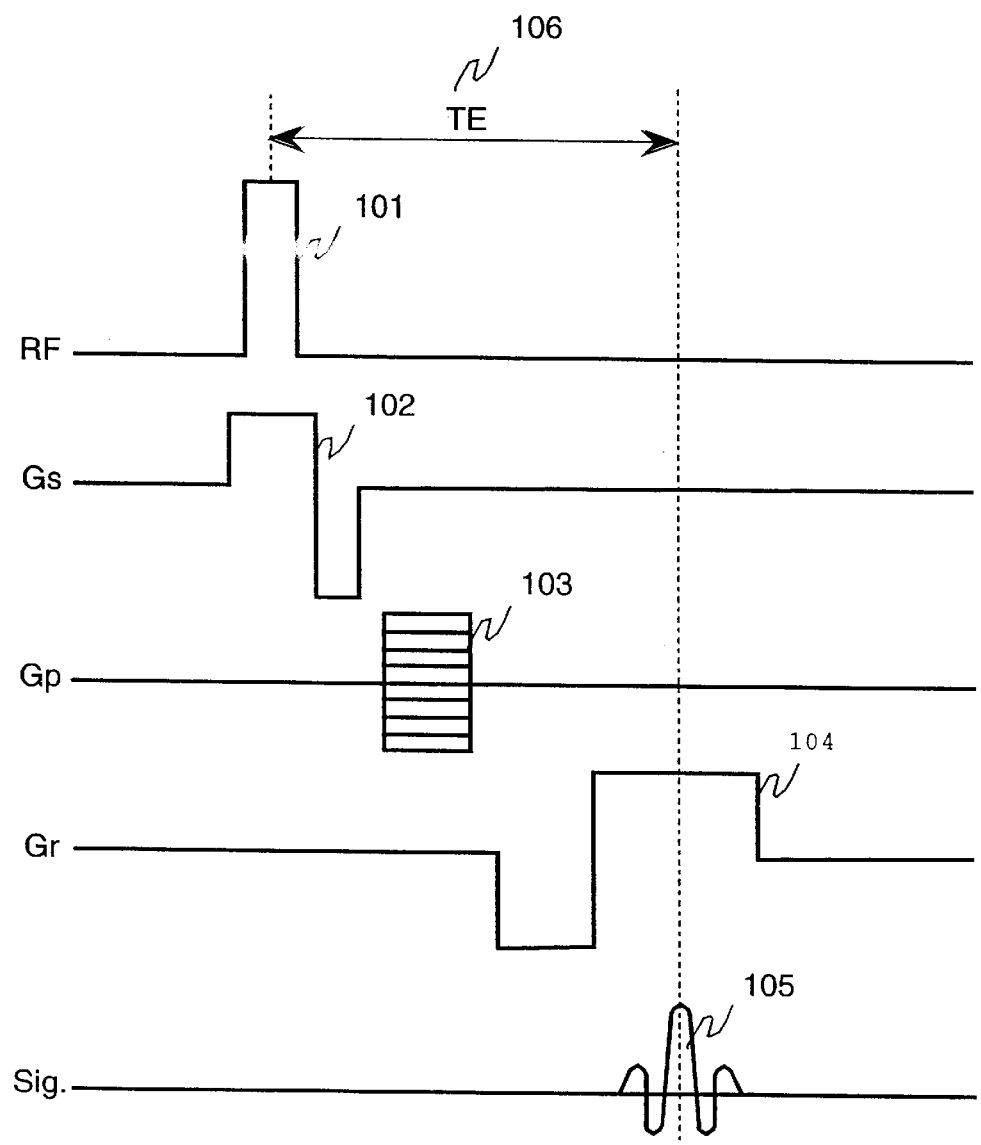
FIG. 1 shows an ordinary sequence for measuring a phase distribution.

First, a set of complex signals for reconstructing a single image is acquired by performing a predetermined imaging sequence (steps 301 and 310). The imaging sequence is not particularly limited and may be, for example, a sequence of the gradient echo method, offset spin-echo method, echo-planar imaging method or the like. In this embodiment, echo signals are measured according to the pulse sequence of the gradient echo method shown in FIG. 1. First, gradient echoes are generated by applying 90° RF pulse 101 (referred to 90° pulse hereafter) together with a gradient magnetic field Gs102 for a slice selection to excite spins of the object to be examined, and applying a gradient magnetic field Gp103 and a read-out gradient magnetic field Gr104 successively to rotate the phase of spins. The pulse sequence of FIG. 1 is repeatedly performed while changing the intensity of the phase encoding gradient magnetic field Gp103 to measure data required for reconstruction of a single image.

This measurement of complex signals is performed at different times t1 and t2 (steps 300, 310) and data measured at the different times are processed as follows. First, 2-dimensional Fourier transformation is performed on the acquired complex signals to obtain complex image S (x, y) data and the object part is extracted from the image data (steps 301, 311). A known method for profile determination or area extraction may be used for extracting the object part. In this embodiment, pixels having an absolute value Sa (x, y) of the complex image S (x, y) greater than a predetermined threshold are extracted as the portion where the object exists. As the threshold, 20% of maximum value of Sa (x, y) may be employed, for example.

Next, the phase distribution $\phi$ (x, y) is found from the complex image S (x, y) using the equation (1) (steps 302, 312).

$$\phi(x,y)=\tan^{-1}\{Si(x,y)/Sr(x,y)\} \quad (1)$$

Here, phase of areas other than the object part extracted at steps 301 and 311 is made zero (steps 303, 313).

Figure 4:
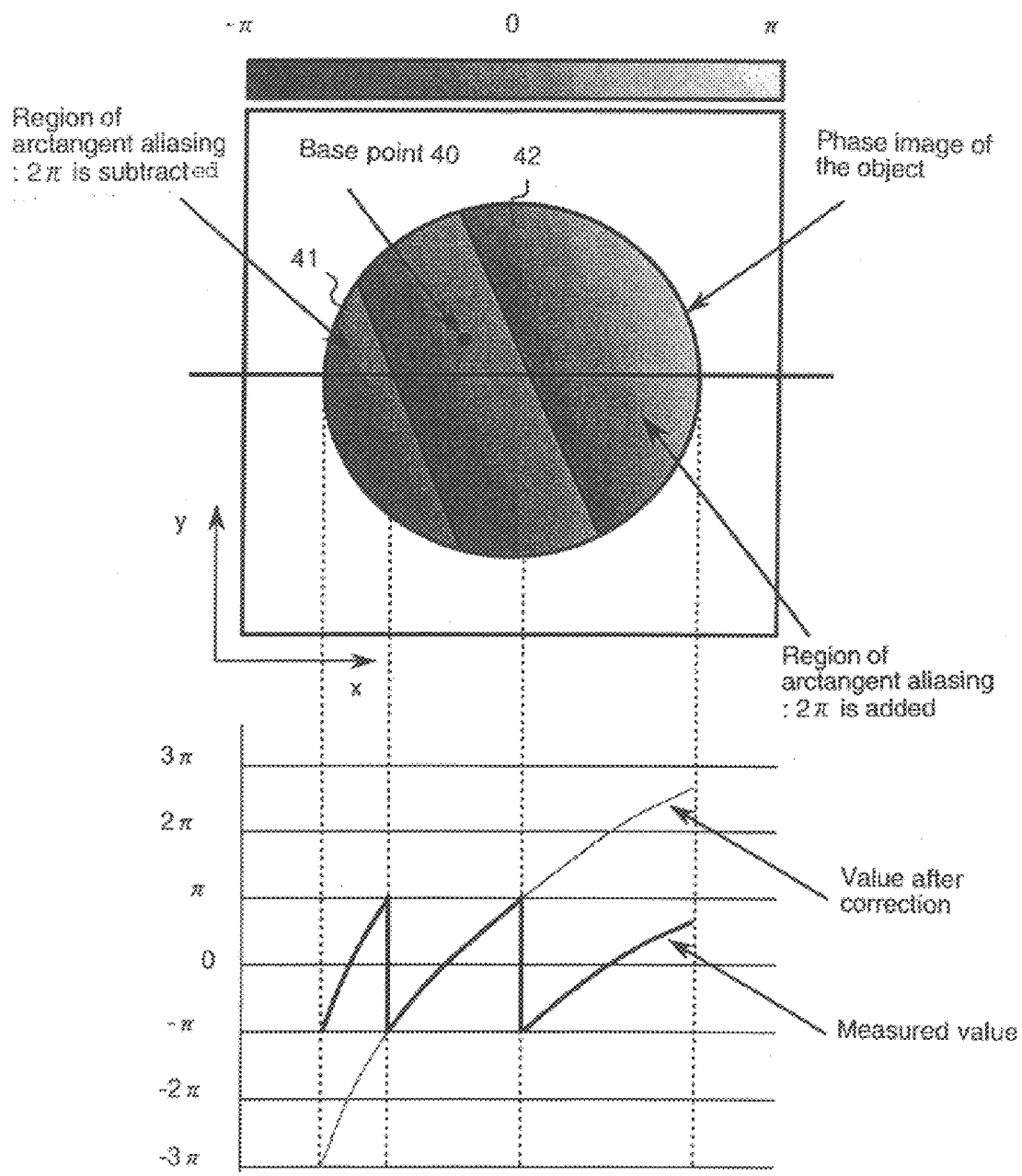
FIG. 4 is an explanatory view of arctangent aliasing and correction thereof.

The arctangent aliasing may be produced in the thus obtained spatial phase distribution as shown in FIG. 4, since arctangent operation has been performed. Then, correction for removing this arctangent aliasing is performed (steps 304, 314). Among many proposed methods for the phase correction, the following method may be employed. Specifically, one pixel in the object data is defined as a base point (starting point) and phases of adjacent points are compared successively from the base point to detect a point whose phase difference becomes greater than a predetermined threshold. The area beyond the point is regarded as arctangent aliasing and $2\pi$ is added to or subtracted from the phase of pixels in that area. It is preferable that the base point be selected from an area where the temperature has not changed.

Figure 5:
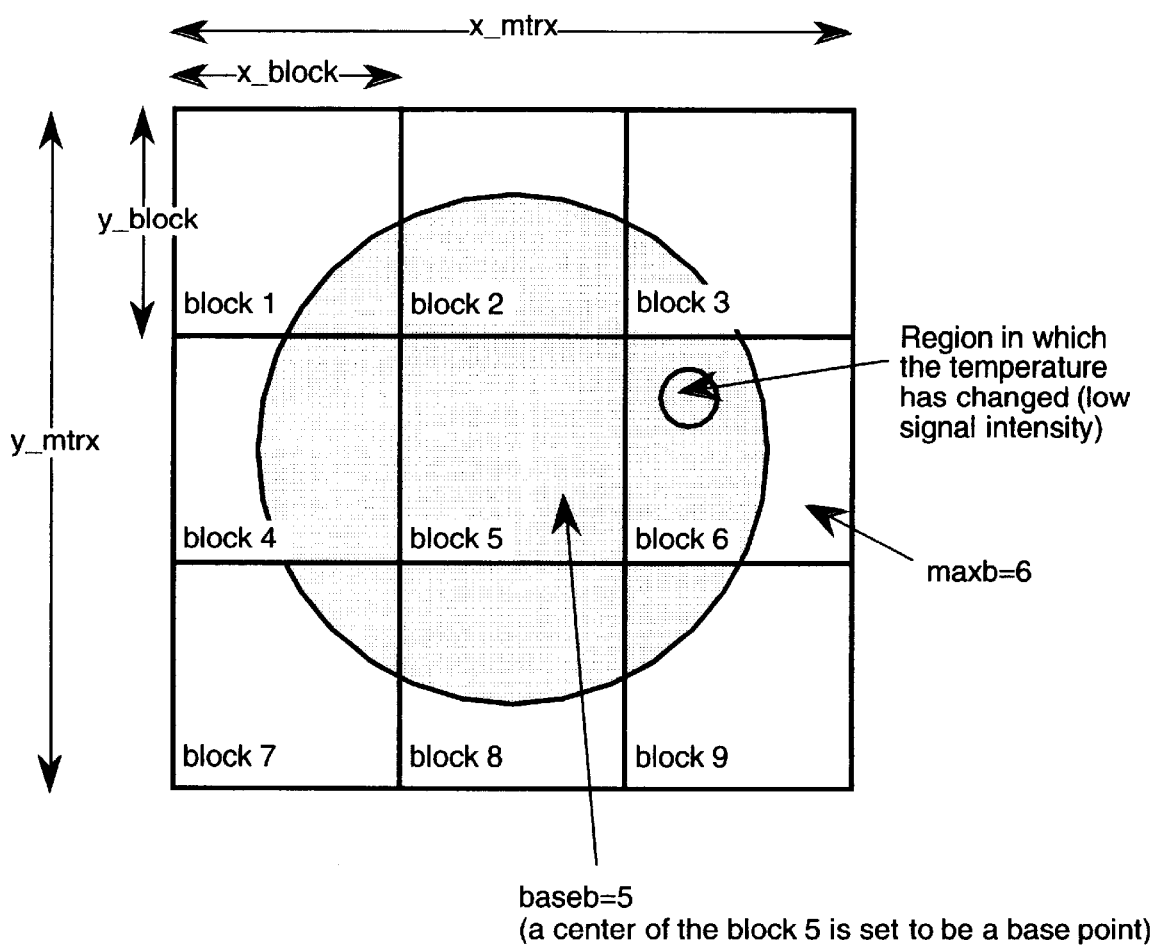
FIG. 5 is a flowchart showing a procedure for arctangent aliasing correction.
Figure 6:
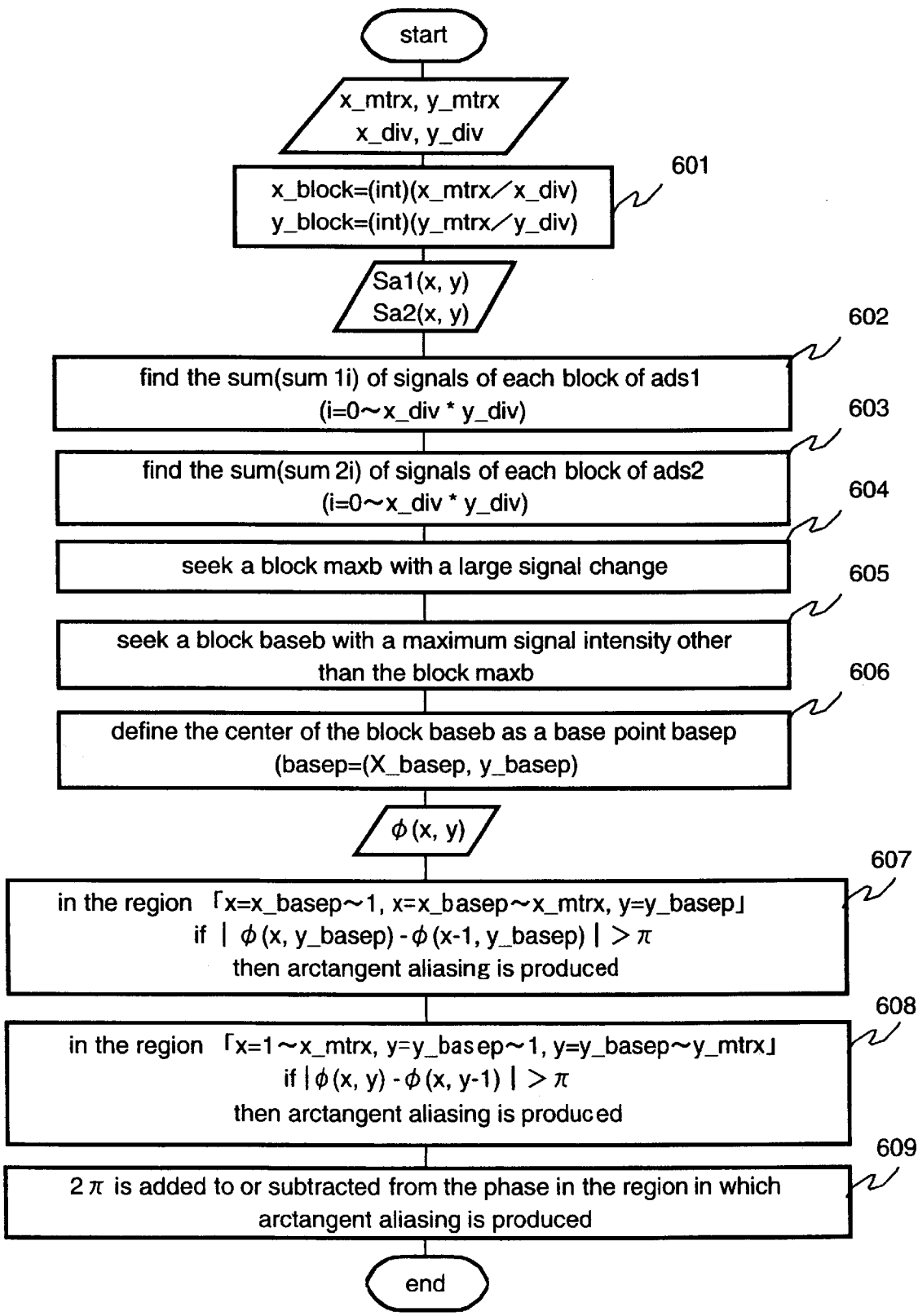
FIG. 6 is an explanatory view of the procedure for arctangent aliasing correction.

A procedure of the phase correction will be further explained with the reference to FIGS. 5 and 6 hereafter.

In order to find an area in which the temperature has not changed and to establish a base point in the area, the area to be imaged is partitioned into a multiple blocks as shown in FIG. 5. That is, the area consisting of a number (x_mtrx) of pixels in the x direction and a number (y_mtrx) of pixels in the y direction is divided into (x_div) in the x direction and (y_div) in the y direction to make (x_div)*(y_div) blocks (step 601). In the example shown in FIG. 5, (x_div)=(y_div)=3 and therefore the number of blocks is 9.

Next, using the absolute value data Sa1, Sa2 of the complex image obtained at times t1 and t2, the sums of the absolute value data sum1i (i is one of the integers 1-9 (number of blocks)), sum2i are found for each block (steps 602 and 603). Since temperature change can be regarded as being larger when the difference between the sums of the absolute values (sum1i-sum2i) is larger, block maxb with a maximum difference of the sums is found (step 604). In the illustrated example, an area where the temperature change is large exists within a block 6. In order not to select a base point from the block where the temperature change is large, a block baseb with maximum sums of the absolute values, which is a block other than the block maxb, is saught (step 605). Thereby, the area which includes no or little background part and where the temperature has not changed can be selected. In the illustrated example, the block 5 has been selected. A central point basep (x_basep, y_basep) of this block baseb is selected as a base point (step 606).

Next, the phase difference of adjacent points is investigated using basep as a base point, and a region in which the arctangent aliasing has occurred is determined. For this purpose, at the point y=y_basep, phase difference between adjacent points is found successively from x=(x_basep) to x=1 and from x=(x_basep) to x=(x_mtrx). And a point in which the absolute value of the phase difference satisfies $|\phi(x, y\_basep)-\phi(x-1, y\_basep)|>\pi$ is found (step 607). Next, phase difference between adjacent points is found successively from y=(y_basep) to y=1 and from y=(y_basep) to y=(y_mtrx) throughout the region of X (1-x_mtrx). And a point in which the absolute value of the phase difference satisfies $|\phi(x,y)-\phi(x, y-1)|>\pi$ is found (step 608). By performing these steps, portions where the arctangent aliasing is produced can be found as lines 41, 42 in a 2-dimensional plane as shown in FIG. 4.

Although the base point 40 in FIG. 4 does not coincide with a central point of block 5 in FIG. 5, the position of the base point differs depending on the number of blocks and therefore the same steps of finding the phase difference can be employed wherever the base point exists, i.e., at the base point illustrated in FIG. 4 or the center point of block 5 in FIG. 5. Starting from the base point 40, the region (area) beyond the lines 41, 42 is determined as an area where arctangent aliasing has been produced and $2\pi$ is added to or subtracted from the phase of the area (step 609, graph of FIG. 4). Whether to add or subtract is determined depending on the phase value of the area in which aliasing has been produced. If the phase is larger than the phase of the base point, $2\pi$ is subtracted from the phase value and if smaller, $2\pi$ is added to the phase value.

Although the threshold for detecting arctangent aliasing is set to $\pi$ in the above-mentioned example, the threshold is not limited to $\pi$. Further, although it has been explained that the phase difference is investigated in the x direction and y direction, it may be carried out in a slanting direction, in a radial manner, in a spiral manner or any combination thereof.

Figure 3:
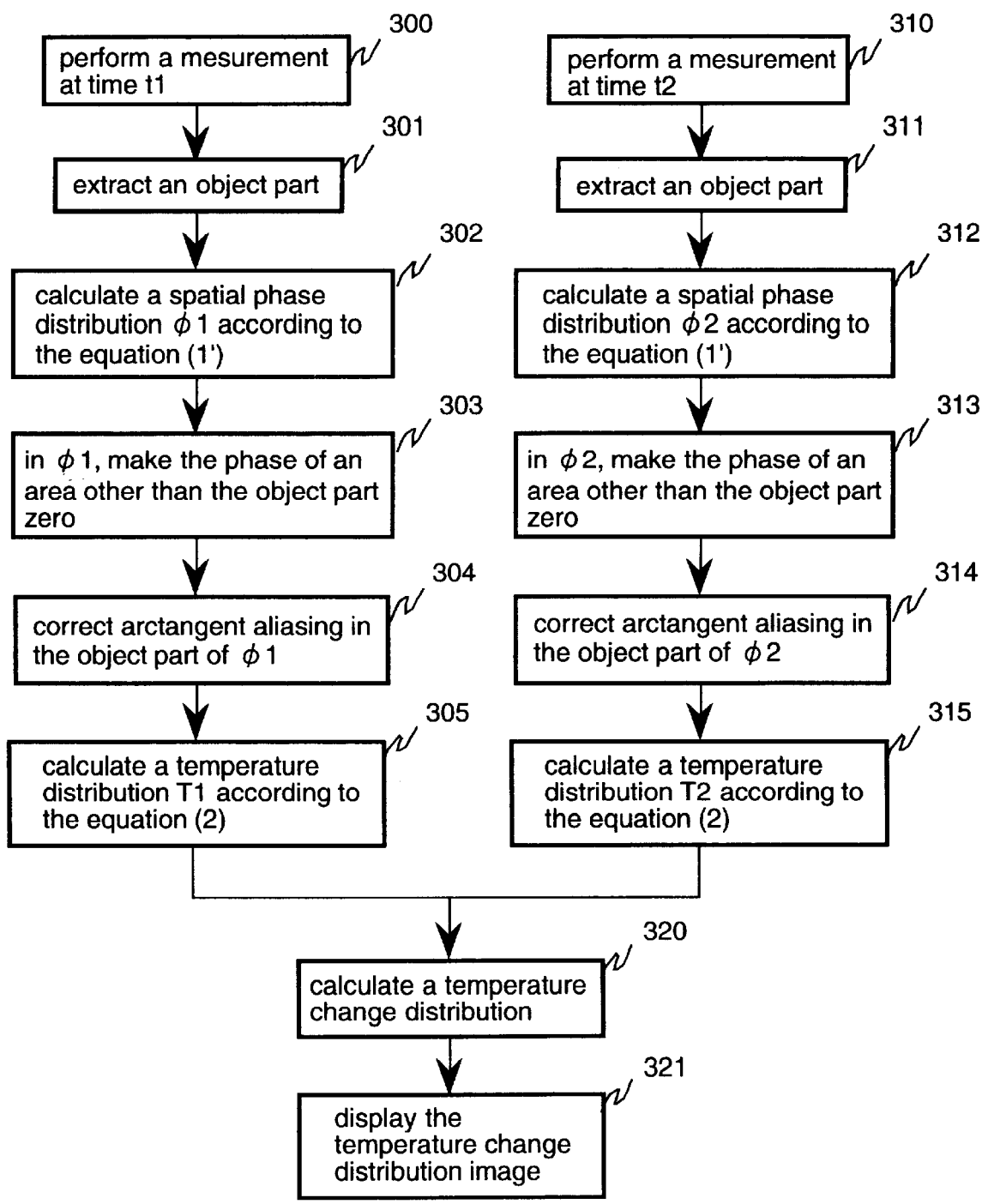
FIG. 3 is one exemplary flowchart showing a procedure of measurement of temperature change distributions using the MRI apparatus of the present invention.

Such an arctangent aliasing correction is carried out respectively for spatial phase distributions obtained from two complex images measured at different times t1, t2 for the same object (FIG. 3: steps 304 and 315). Based on the corrected spatial phase distributions $\phi 1 (x, y)$ and $\phi 2 (x, y)$, temperature distributions T1 (x, y) and T2 (x, y) are calculated according to the equation (2) (steps 305 and 315).

$$T[°C.] = \frac{\phi \text{ [degree]}}{TE[s] \times f[Hs] \times 0.01[\text{ppm}/°C.] \times 10^{-6} \times 360 \text{ [degree]}} \quad (2)$$

Next, subtraction of T1 (x, y) and T2 (x, y) is performed to find temperature change distribution $\Delta T(x, y)$ produced during the time between t1 and t2 (step 320). This temperature change distribution is converted into image data, and displayed as a temperature change distribution image (step 321). By this, a highly precise temperature change distribution image in which the false image caused by the background noise or arctangent aliasing is eliminated can be obtained.

Known techniques for imaging the temperature change distribution can be employed. Such techniques include, for example, 1) displaying the temperature change value as two values using a threshold (for example, a region in which temperature has changed is depicted with white and a region in which temperature has not changed is depicted with black), 2) displaying pixels in which temperature change value is not less than a threshold with colors (red) or outlining the region with a higher value than the threshold, 3) depicting with graduation proportional to temperature changes. It is preferable that the image data of temperature changes be combined with an image (absolute-value image) reconstructed from echo signals acquired in steps 300 and 301. This enables observation of the temperature-changed region on the tissue image. In this case, the temperature change image is preferably displayed in front so that the temperature-changed region can be observed without being embedded in the tissue image.

Figure 7:
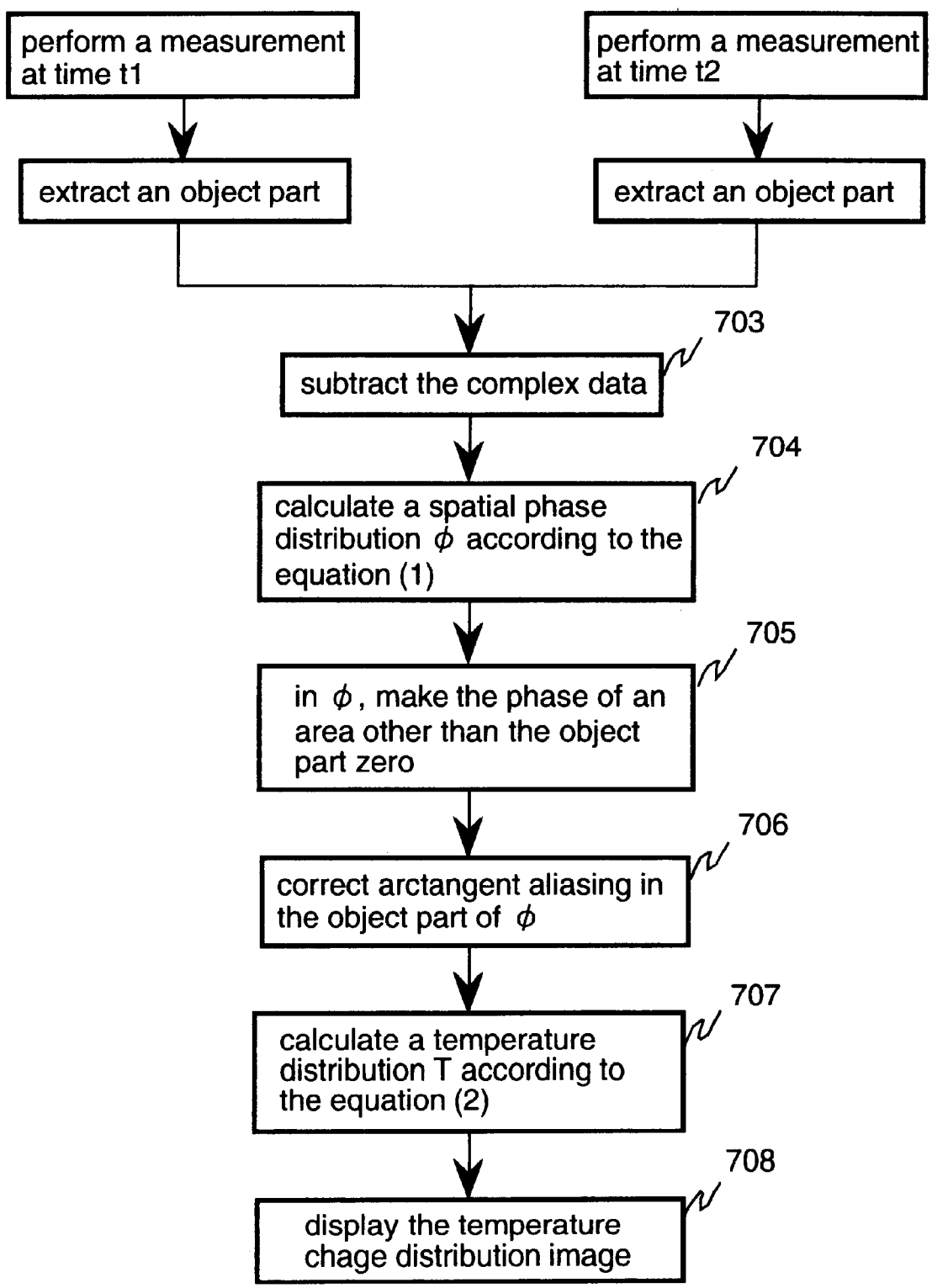
FIG. 7 is another exemplary flowchart of a procedure of the temperature change distribution measurement using the MRI apparatus of the present invention.
Figure 8:
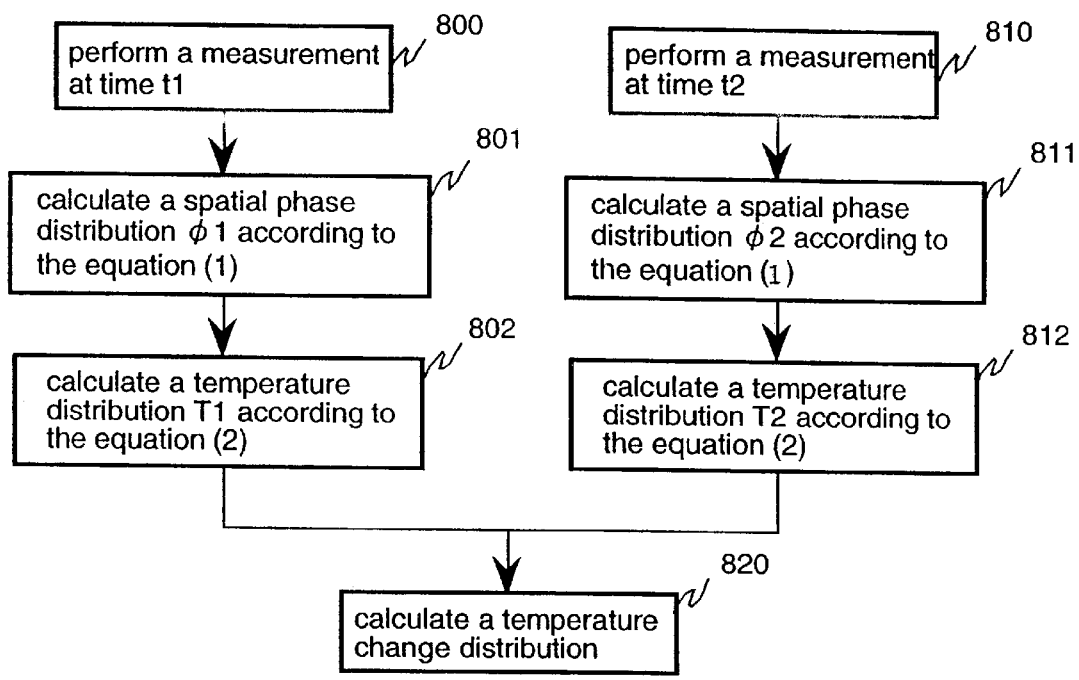
FIG. 8 is a flowchart explaining the conventional temperature change distribution acquisition procedure.

Regarding the example shown in FIG. 3, it was explained that the temperature change distribution is calculated by conducting a spatial phase distribution calculation, arctangent correction, and temperature distribution calculation for the extracted data of the object part of each of two complex images, and subtracting the temperature distributions. However, the extracted data from the complex images may be subtracted first (703) as shown in FIG. 7. In this case, a spatial phase distribution calculation (704), processing of the phase of an area other than the object part to be zero (705), arctangent aliasing correction (706), temperature distribution calculation (707) and displaying (708) are performed on the difference data.

According to the embodiment of FIG. 7, the processing volume of the operating means (computer) can be reduced and the load on the apparatus lowered. In addition, the time resolution of temperature distribution image display can be improved.

Although it was explained that operations are conducted on two images obtained at different times in the above-mentioned embodiments, when a tissue having spins with the phase varying depending on the temperature change and spins with the phase not varying together (such as liver tissue) is imaged, subtraction operation may be performed between an image which does not reflect the temperature change (for example, fat image) and an image which reflects the temperature change (for example water image). In this case, known techniques for suppressing signals from one type of spins can be employed for obtaining an enhanced image of specific spins.

Furthermore, although the arctangent aliasing correction is performed only within a 2-dimensional image in the above embodiment, it is preferably performed in a slice direction in multiple-slice imaging. For example, the aliasing correction within the 2-dimensional image may be extended to the slice direction (z direction, 1-z_mtrx) or measurement of the phase difference throughout the x direction may be omitted and measurement only in the y and z directions may be performed. For the z direction, the phase difference may be measured only from the base point in the z direction.

As explained above, the MRI apparatus of the present invention makes it possible to eliminate influence of background noise and to display relatively small temperature changes accurately. In addition, highly precise temperature changes can be measured, and it becomes easy to recognize the temperature change distribution in an object.

What is claimed is:

1. A method of measuring a temperature distribution of an object to be examined based on nuclear magnetic resonance signals emitted from the object comprising the steps of:
    a) forming image data from the nuclear magnetic resonance signals measured at time t1;
    b) extracting an object part from the image data;
    c) calculating a spatial phase distribution from the extracted image data;
    d) calculating a spatial temperature distribution based on the spatial base distribution;
    e) performing steps from a) to d) for nuclear magnetic resonance signals measured at time t2 and calculating a spatial temperature distribution at time t2; and
    f) subtracting the spatial temperature distributions calculated for measurements at t1 and t2 and calculating a temperature change distribution;
    wherein the step c) includes a step of correcting arctangent aliasing produced in the spatial phase distribution; and
    wherein, in the step of correcting arctangent aliasing, a point in a region in which the temperature has not changed is selected as a base point of phase value.

2. A method of measuring a temperature distribution of an object to be examined based on nuclear magnetic resonance signals emitted from the object comprising the steps of:
    a) forming image data from the nuclear magnetic resonance signals measured at different times t1 and t2;
    b) obtaining image data difference by performing subtraction on two image date after extracting an object part from each image data;
    c) calculating a spatial phase distribution from the image data difference;
    d) calculating a spatial temperature distribution representing temperature changes between the time t1 and t2 based on the spatial phase distribution;
    wherein the step c) includes a step of correcting arctangent aliasing produced in the spatial phase distribution; and
    wherein, in the step of correcting arctangent aliasing, a point in a region in which the temperature has not changed is selected as a base point of phase value.

3. A magnetic resonance imaging (MRI) apparatus comprising means for imparting a static magnetic field to an object to be examined, means for applying a plurality of gradient magnetic fields to the object, means for generating radio-frequency pulses to cause magnetic resonance in atomic nuclei of atoms constituting the object, detecting means for measuring nuclear magnetic resonance (NMR) signals from the object, operating means for performing operations on the NMR signals to produce temperature information of the object, and display means for displaying a result of the operations,
    wherein the operating means comprises means for producing image data using the NMR signals obtained in plural measurements performed at different times respectively, means for calculating data indicating temperature distribution within the object for image data of each measurement time, means for correcting spatial discontinuity of the calculated temperature distribution data, means for calculating temperature change distribution within the object between different measurement times by subtracting the corrected temperature distribution data of each measurement time, and means for transforming the calculated temperature change distribution to indicative data to supply to the display means.

4. The MRI apparatus according to claim 3, wherein the image data is a complex image obtained by Fourier transformation of the NMR signals.

5. The MRI apparatus according to claim 4, wherein the data indicating the temperature distribution within the object is a spatial phase distribution calculated from the complex image.

6. The MRI apparatus according to claim 5, wherein the means for calculating the data indicating the temperature distribution within the object includes means for correcting arctangent aliasing produced in the spatial phase distribution.

7. A magnetic resonance imaging (MRI) apparatus comprising means for imparting a static magnetic field to an object to be examined, means for applying a plurality of gradient magnetic fields to the object, means for generating radio-frequency pulses to cause magnetic resonance in atomic nuclei of atoms constituting the object, detecting means for measuring nuclear magnetic resonance (NMR) signals from the object, operating means for performing operations on the NMR signals to produce temperature information of the object, and display means for displaying a result of the operations,
    wherein the operating means comprises means for producing a complex image using the NMR signals obtained in plural measurements performed at different times respectively, means for extracting an object part from each complex image, means for calculating spatial phase distribution for each complex image, means for correcting arctangent aliasing produced in the spatial phase distribution, means for calculating temperature distribution data based on the corrected spatial phase distribution, means for calculating temperature change distribution from the difference between the calculated temperature distribution data, and means for forming images of the temperature change distribution.

8. The MRI apparatus according to claim 7, wherein the means for calculating the spatial phase distribution obtains the spatial phase distribution according to the following equation, $$\phi(x,y,z)=\tan^{-1}\{Si(x,y,z)\}$$

where ($\phi$ represents a phase, Si is an imaginary part of a complex signal, and Si is a real part of the complex signal, and each parameter is a function of a space (x,y,z).

9. The MRI apparatus according to claim 7, wherein the means for calculating the spatial phase distribution makes a phase of areas other than the extracted object part zero.

10. The MRI apparatus according to claim 7, wherein the means for correcting the arctangent aliasing finds an area where the phase difference of pixel points from a base pixel point in which the temperature is considered not to be changed is more than $\pi$ or less than $-\pi$, and adds or subtracts $2\pi$ to or from the phase of pixel points within the area.

11. The MRI apparatus according to claim 7, wherein the operating means further comprises means for reconstructing absolute value images from the NMR signals, and produces and displays a composed image of the temperature change distribution image with an absolute value image.

12. The MRI apparatus according to claim 7, wherein the operating means makes values of a temperature change binary values using a threshold value and displays temperature-changed areas and no-temperature-changed areas in binary indication.

13. The MRI apparatus according to claim 7, wherein the operating means displays pixels in which a temperature change value is not less than a threshold value with red color.

14. The MRI apparatus according to claim 7, wherein the operating means displays an outline of a region in which a temperature change value is higher than a threshold value.

15. The MRI apparatus according to claim 7, wherein the operating means displays the temperature change distribution with graduation proportional to temperature change.

16. A method of measuring a temperature distribution within an object to be examined based on nuclear magnetic resonance (NMR) signals emitted from the object comprising the steps of:
   a) forming image data from the NMR signals measured at time t1;
   b) extracting an object part from the image data;
   c) calculating a spatial phase distribution from the extracted image data;
   d) correcting arctangent aliasing generated in the spatial phase distribution;
   e) calculating a temperature distribution based on the corrected spatial phase distribution;
   f) performing steps from a) to e) for NMR signals measured at time t2 and calculating a temperature distribution at time t2;
   g) subtracting the temperature distributions calculated for measurements at t1 and t2 to produce a temperature change distribution of the object part; and
   h) displaying the temperature change distribution on a display device as an image.

17. The method of measuring a temperature distribution according to claim 16, wherein the step d) of correcting the arctangent aliasing further includes steps of investigating a region where the arctangent aliasing generates, determining a base point within the spatial phase distribution for the investigation, finding an area where the phase difference of points from the base point is more than $\pi$ or less than $-\pi$.

18. The method of measuring a temperature distribution according to claim 17, wherein the base point is selected from a region where the temperature has not changed.

19. The method of measuring a temperature distribution according to claim 17, wherein the step of determining the base point includes steps of dividing the spatial phase distribution of the object into plural blocks, calculating sum of absolute values of pixels within each block, and determining the base point in a block other than a block with maximum difference of the sum of absolute values at t1 and t2.

20. A method of measuring a temperature distribution of an object to be examined based on nuclear magnetic resonance (NMR) signals emitted from the object comprising the steps of:
   a) forming a first image data from the NMR signals measured at time t1;
   b) forming a second image data from the NMR signals measured at time t2;
   c) subtracting the first image data from the second image data to produce a difference image data;
   d) calculating a spatial phase distribution from the difference image data;
   e) correcting arctangent aliasing generated in the spatial phase distribution;
   f) calculating a temperature change distribution within the object between the time t1 and time t2 based on the corrected spatial phase distribution; and
   g) displaying the temperature change distribution as an image.

21. A method of measuring and displaying a temperature distribution of an object to be examined based on nuclear magnetic resonance (NMR) signals emitted from the object comprising the steps of:
   a) forming image data from the NMR signals measured from the object;
   b) calculating a spatial phase distribution of the image data;
   c) correcting arctangent aliasing generated in the spatial phase distribution;
   d) calculating a temperature distribution within the object based on the corrected spatial phase distribution; and
   e) displaying the temperature distribution as an image.

* * * * *